(12) United States Patent
Shibata

(10) Patent No.: US 6,448,660 B2
(45) Date of Patent: Sep. 10, 2002

(54) SEMICONDUCTOR DEVICE AND PRODUCTION PROCESS THEREOF

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/814,058

(22) Filed: Mar. 22, 2001

(30) Foreign Application Priority Data

Mar. 28, 2000 (JP) ......................................... 2000-089174

(51) Int. Cl.$^7$ ................................................ H01L 23/48

(52) U.S. Cl. .................. 257/777; 257/754; 257/755; 257/757; 257/758

(58) Field of Search ................................ 257/754, 755, 257/757, 758, 759, 760; 438/622, 630, 637, 647

(56) References Cited

U.S. PATENT DOCUMENTS 6,326,691 B1 * 12/2001 Kohyama et al. ........... 257/754

* cited by examiner

*Primary Examiner*—Hoai Ho
*Assistant Examiner*—Mai-Huong Tran
(74) *Attorney, Agent, or Firm*—Rader, Fishman & Grauer PLLC

(57) ABSTRACT

A semiconductor device having a pad for electrical connection provided on a semiconductor substrate, a first insulating film with which a surface of the semiconductor substrate is coated and having an opening to which the pad is exposed, a conductive film joined to the pad on a bottom surface of the opening of the first insulating film and extending to a surface of the first insulating film outside the opening, a second insulating film with which the conductive film is coated and having an opening to which a part of the conductive film is exposed, and a connecting member arranged so as to be joined to the conductive film inside the opening of the second insulating film.

4 Claims, 2 Drawing Sheets

SEMICONDUCTOR DEVICE AND PRODUCTION PROCESS THEREOF

BACKGROUND OF THE INVENTION

1. Field of the Invention

The present invention relates to a semiconductor device having a conductive film connected to a pad on a semiconductor substrate and a production process thereof.

2. Description of Related Art

In a chip-on-chip structure in which active surfaces of a pair of semiconductor chips are overlapped with each other, and in a flip chip bonding structure in which a semiconductor chip is joined to a wiring board with its active surface opposed to the wiring board, a projection for electrical connection called a bump is provided on the active surface of the semiconductor chip. FIG. 3 illustrates construction in the vicinity of a surface of the semiconductor chip.

A pad 52 to which a part of an external wiring is exposed is provided on an active surface 51a of a semiconductor substrate 51. The active surface 51a of the semiconductor substrate 51 is covered with a polyimide film 54 having an opening 53 to which the pad 52 is exposed. A bump 55 is arranged on the pad 52 in the opening 53. The bump 55 projects from a surface of the polyimide film 54.

The bump 55 is formed by electroless plating, for example. In the electroless plating, a metal film having good adhesive properties cannot be formed on the surface of the polyimide film 54. By merely growing a thick film of a conductor such as gold or copper on the pad 52 inside the opening 53, therefore, the bump 55 is formed.

However, it takes long to form the thick film by the electroless plating. Accordingly, it takes significantly long to fill in the opening 53 formed in the polyimide film 54 and form the bump 55 projecting from the surface of the polyimide film 54. Therefore, time required to produce the semiconductor chip is long.

SUMMARY OF THE INVENTION

An object of the present invention is to provide a semiconductor device, having a connecting member, whose productivity can be improved and a production process thereof.

Another object of the present invention is to provide a process of producing a semiconductor device, in which a low-resistive conductive film having good adhesive properties can be formed on a surface of an insulating film on a semiconductor substrate in a short time.

A semiconductor device according to the present invention comprises a pad for electrical connection provided on a semiconductor substrate; a first insulating film with which a surface of the semiconductor substrate is coated and having an opening to which the pad is exposed; a conductive film joined to the pad on a bottom surface of the opening of the first insulating film and extending to a surface of the first insulating film outside the opening; a second insulating film with which the conductive film is coated and having an opening to which a part of the conductive film is exposed; and a connecting member arranged so as to be joined to the conductive film inside the opening of the second insulating film.

The semiconductor device can be produced by a production process comprising the steps of coating a surface of a semiconductor substrate, provided with a pad for electrical connection, with a first insulating film having an opening to which the pad is exposed; modifying a surface of the first insulating film and an inner wall surface of the opening; forming by an ion-exchange reaction a thin conductive film with which the surface of the first insulating film, the inner wall surface of the opening, and a surface of the pad exposed on a bottom surface of the opening is coated; thickening the thin conductive film by electroplating with power being fed using the thin conductive film; forming a second insulating film with which the thickened conductive film is coated and having an opening to which a part of the conductive film is exposed; and forming a connecting member joined to the thickened conductive film inside the opening of the second insulating film.

According to the process, by modifying the surface of the first insulating film and the inner wall surface of the opening formed in the first insulating film, the thin conductive film having good adhesive properties can be formed by utilizing the ion-exchange reaction on the modified surfaces. Power can be fed using the thin conductive film, thereby making it possible to thicken the thin conductive film by the electroplating. The conductive film can be thickened in a short time by the electroplating. As a result, the thickened conductive film having good adhesive properties can be quickly formed on the first insulating film. After the thickened conductive film is then coated with the second insulating film, and the opening is formed in the second insulting film, the connecting member joined to the thickened conductive film may be formed in the opening.

The surface modification processing for the first insulating film may be processing for introducing a cation exchange group into the surface of the first insulating film. The surface of the first insulating film which has been subjected to the surface modification processing is brought into contact with a solution containing ions of a metal material to compose the conductive film, thereby making it possible to produce the ion-exchange reaction. By the ion-exchange reaction, the metal ions are replaced with the cation exchange group, and the cation exchange group is sucked by the surface of the first insulating film.

The connecting member may be a bump for connection to another solid device (e.g., another semiconductor chip or wiring board).

The connecting member may be another conductive film joined to the conductive film on the bottom surface of the opening in the second insulating film and extending to the surface of the second insulating film. In this case, a so-called multi-layered wiring structure is constituted by a two-layer conductive film insulated by the second insulating film.

The first insulating film may be composed of polyimide resin. In this case, the modification processing for the surface of the first insulating film and the inner wall surface of the opening formed in the first insulating film may be processing for cleaving an imide ring of the polyimide resin using a potassium hydroxide solution, for example, and introducing a carboxyl group serving as the cation exchange group into the surface of the first insulating film. Thereafter, the first insulating film is immersed in the solution containing the ions of the metal material composing the connecting member, thereby making it possible to produce the ion-exchange reaction on the surface of the first insulating film and form the connecting member composed of the metal material on the surface of the first insulating film, the inner wall surface of the opening, and the surface of the pad.

As a material for the first insulating film, epoxy resin, for example, can be used in addition to the polyimide resin. In this case, the surface modification processing for the first insulating film may be processing for immersing the first insulating film in a sulfuric acid solution to introduce a sulfo group serving as the cation exchange group into its surface. When an epoxy resin film which has been thus subjected to the surface modification processing is immersed in the solution containing the metal ions to produce the ion-exchange reaction, the metal ions are sucked by the surface of the first insulating film.

As a material for the first insulating film, resin including an imide bond or an acido bond or including both an imide bond and an acido bond can be used in addition thereto.

As the second insulating film, the resin including an imide bond or an acido bond or both an imide bond and an acido bond can be used, in addition to the polyimide resin or the epoxy resin, as a material composing the second insulating film, similarly to the first insulating film. Particularly when a multi-layered wiring structure is formed using a pair of conductive films insulated by the second insulating film, it is preferable that the surface of the second insulating film and the inner wall surface of the opening are subjected to the above-mentioned surface modification processing using the polyimide resin or the epoxy resin as the material composing the second insulating film.

A process according to another mode of the present invention comprises the steps of forming an insulating film on a semiconductor substrate; modifying a surface of the insulating film; forming a thin conductive film by an ion-exchange reaction on the modified surface of the insulating film; and thickening the thin conductive film by electroplating for feeding power using the thin conductive film.

According to the process, the conductive film having good adhesive properties can be formed on the surface of the insulating film by performing the ion-exchange reaction subsequently to the surface modification processing for the insulating film. The thin conductive film is thickened by the electroplating, thereby making it possible to form a low-resistive conductive film having good adhesive properties in a short time on the insulating film. This can contribute to an improvement in the productivity of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1A to 1E are cross-sectional views showing the steps of a process of producing a semiconductor device according to a first embodiment of the present invention. A plurality of device forming regions corresponding to a plurality of semiconductor chips are provided on a surface of a semiconductor wafer W (a semiconductor substrate), and the plurality of device forming regions are separated by a scribe line region L. The scribe line region L is a region along a cutting line in a case where the semiconductor chips are cut out of the wafer W by a dicing saw.

In the device forming region corresponding to each of the semiconductor chips, a pad P for electrical connection to another solid device (a semiconductor chip or a wiring board, etc.) is provided on an active surface Wa. The pad P is exposed from an opening 11a formed in a first polyimide film 11 (a first insulating film) with which the active surface Wa is coated. The pad P is an exposed part of an internal wiring electrically connected to an internal circuit, comprising functional devices such as transistors and resistors, formed on the active surface.

Figure 1A:
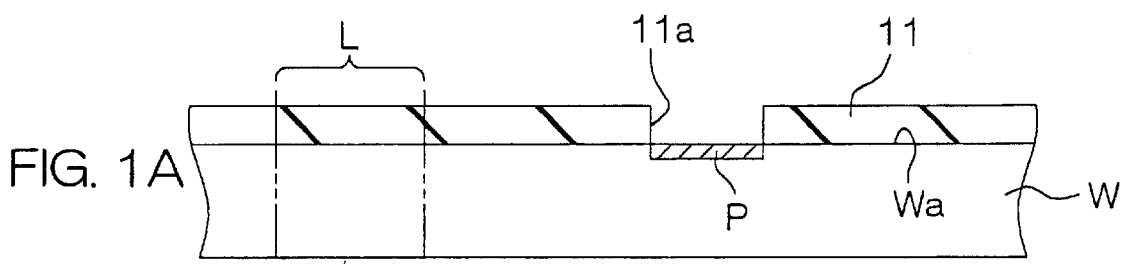
FIGS. 1A to 1E are cross-sectional views showing the steps of a process of producing a semiconductor device according to a first embodiment of the present invention.
Figure 1B:
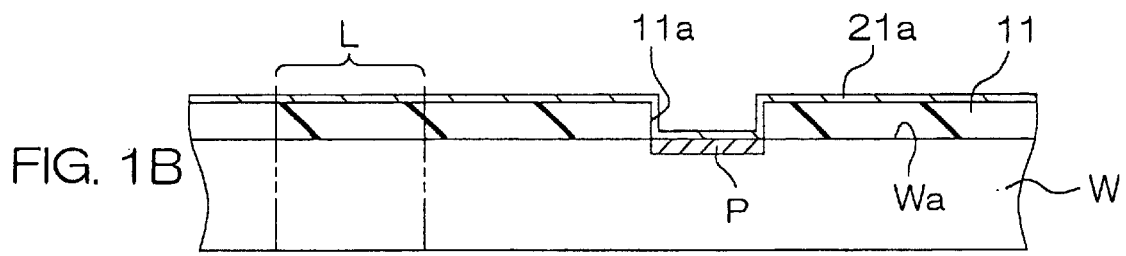

A thin conductive film 21a is formed, as shown in FIG. 1B, from a state shown in FIG. 1A where the first polyimide film 11 is formed on the active surface Wa. A process reported in "Basic study for Direct Metallization Using Surface Modification of Polyimide and Epoxy Resin" (by Nawafune et. al., Journal of JIEP (Japan Institute of Electronics Packaging), Vol. 2, No. 5 (1999), pp 390–393), "Production of Co/Pt Multi-layered Film Utilizing Surface Modification of Polyimide Resin and Magnetic Properties" (by Tamura et. al., the substance of the 99-th Conference of The Surface Finishing Society of Japan (1999), pp 35–36), etc. can be applied to the formation of the thin conductive film 21a.

Specifically, the surface of the first polyimide film 11 and the inner wall surface of the opening 11a are subjected to the surface modification processing. The surface modification processing is performed specifically by immersing in a potassium hydroxide solution the semiconductor wafer W in the state shown in FIG. 1A where the first polyimide film 11 is formed, cleaving an imide ring in a surface layer portion of the first polyimide film 11, and introducing a carboxyl group into the surface of the first polyimide film 11.

The thin conductive film 21a can be thus formed with good adhesive properties by an ion-exchange reaction on the surface of the first polyimide film 11 which has been subjected to the surface modification processing. The ion-exchange reaction can be performed by immersing in a solution containing metal ions the semiconductor wafer W in a state where the first polyimide film 11 has been subjected to the surface modification processing. If the semiconductor wafer W is immersed in a copper sulfate solution, for example, a copper thin film serving as the thin conductive film 21a can be provided on the surface of the first polyimide film 11, the inner wall surface of the opening 11a, and the surface of the pad P.

Figure 1C:
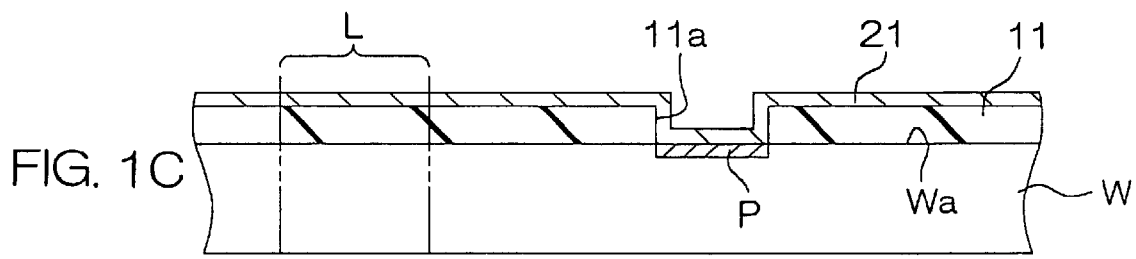

After the thin conductive film 21a is thus formed on the surface of the first polyimide film 11, a thick conductive film 21 is formed, as shown in FIG. 1C, by electroplating for feeding power using the thin conductive film 21a. That is, the conductive film 21 which is made low-resistive is formed on the surface of the first polyimide film 11 by thickening the thin conductive film 21a using the electroplating. The power can be fed at the time of the electroplating by connecting the thin conductive film 21a in the scribe line region L to an electrode.

Since the thin conductive film 21a can be thickened in a short time by the electroplating, the formation of the conductive film 21 formed through the formation of the thin conductive film 21a by the ion-exchange reaction and the thickening thereof can be achieved in a short-time step.

Figure 1D:
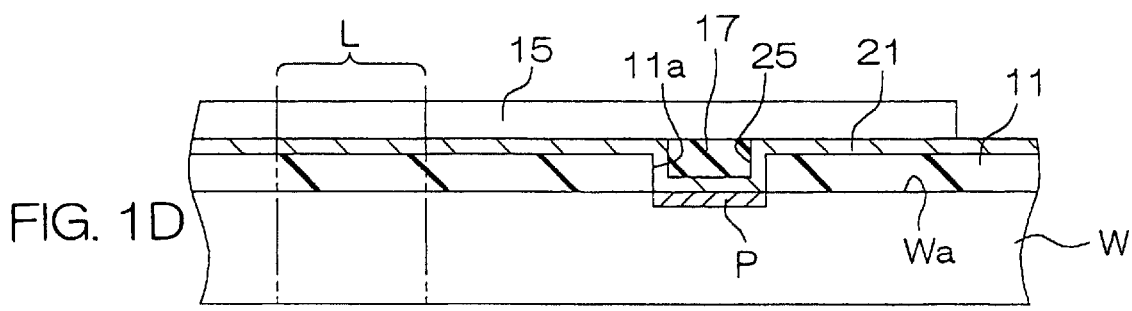

As shown in FIG. 1D, the pattern of a resist film 15 is formed on the surface of the first polyimide film 11. Prior to forming the resist film 15, an insulating film 17 may be buried in a depression 25 formed in a portion, corresponding to the opening 11a, in the thickened conductive film and 21.

Figure 1E:
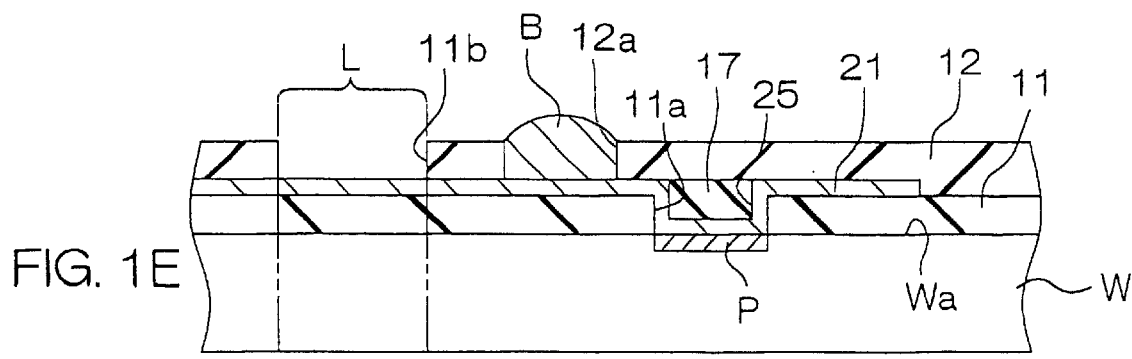

The conductive film 21 is then patterned by etching using the resist film 15 as a mask. Thereafter, as shown in FIG. 1E, the resist film 15 is stripped, and a second polyimide film 12 (a second insulating film) is formed such that a surface of the conductive film 21 and the surface of the first polyimide film 11 exposed by etching away an unnecessary portion of the conductive film 21 are coated therewith. An opening 12a is formed at a position, avoiding the opening 11a in the first polyimide film 11, in the second polyimide film 12. A bump B is provided in the opening 12a.

If an opening 11b is formed in the first polyimide film 11 in the scribe line region L, the bump B can be quickly formed by the electroplating performed by feeding power from the conductive film 21 exposed from the opening 11b. The bump B is formed in the shape of a thick film filling in the opening 12a and projecting from a surface of the second polyimide film 12 in a quick step by the electroplating.

Thereafter, the wafer W is cut by a dicing saw along the scribe line region L, thereby obtaining respective pieces of semiconductor chips.

As described in the foregoing, according to the present embodiment, the thin conductive film 21a is formed by the surface modification processing for the first polyimide film 11 and the ion-exchange reaction for the surface of the first polyimide film 11 after the surface modification processing. The conductive film 21 which is made low-resistive can be provided on the first polyimide film 11 by thickening the thin conductive film 21a. So long time is not required to form the thin conductive film 21a by the ion-exchange reaction. Further, the thin conductive film 21a can be quickly thickened by the electroplating. Consequently, the productivity of the semiconductor chip can be improved.

The semiconductor chip produced in accordance with the process according to the present embodiment has the bump B serving as a connecting member to another solid device at a position shifted from the opening 11a formed in the first polyimide film 11, as shown in FIG. 1E. As a result, the first polyimide film 11 is interposed between the bump B and the active surface Wa of the wafer W serving as the semiconductor substrate. Such a structure is advantageous that when it is joined to another solid device, pressure received by the bump B is not directly exerted on the semiconductor substrate (the wafer W). Further, the first and second polyimide films 11 and 12 are interposed between the other solid device and the active surface Wa of the semiconductor chip. Consequently, the difference in the coefficient of thermal expansion between the solid device and the semiconductor chip can be satisfactorily absorbed. Therefore, stress caused by the difference in the coefficient of the thermal expansion can be effectively prevented from being exerted on the semiconductor substrate.

Figure 2:
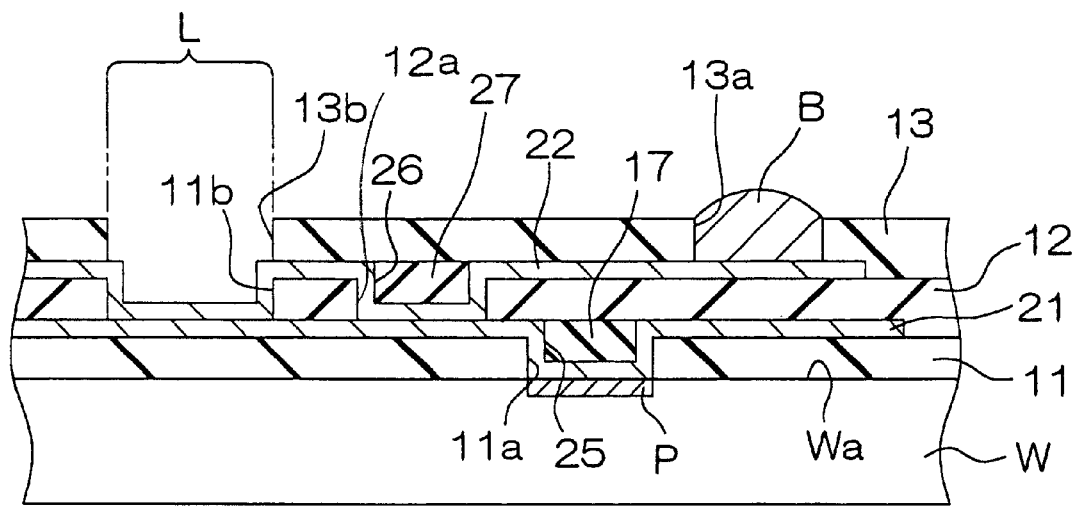
FIG. 2 is an illustrative sectional view for explaining a process of producing a semiconductor device according to a second embodiment of the present invention.
Figure 3:
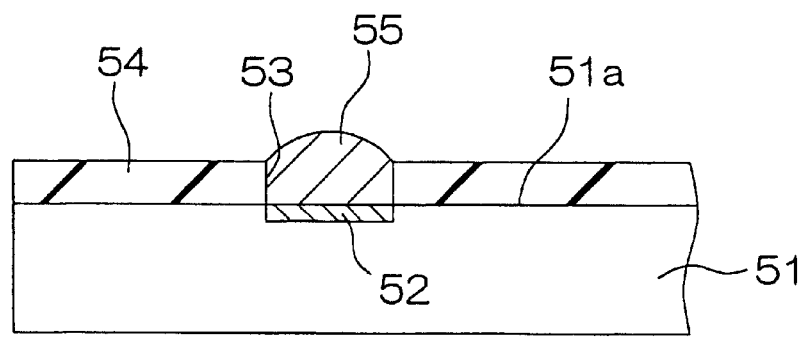
FIG. 3 is a cross-sectional view for explaining the prior art for forming a bump on an active surface of a semiconductor substrate.

FIG. 2 is an illustrative sectional view for explaining a process of producing a semiconductor device according to a second embodiment of the present invention. In FIG. 2, portions corresponding to the portions shown in FIGS. 1A to 1E, described above, are assigned the same reference numerals as those shown in FIGS. 1A to 1E.

In the second embodiment, a multi-layered wiring structure is formed on a wafer W. That is, a second conductive film 22 is formed on a surface of a second polyimide film 12. The second conductive film 22 is joined to a first conductive film 21 at the bottom of an opening 12a formed in the second polyimide film 12. The second conductive film 22 rises along an inner wall surface of the opening 12a, and further extends to the surface of the second polyimide film 12.

The second conductive film 22 can be formed by the same process as that forming the first conductive film 21. That is, surface modification processing for the second polyimide film 12 is performed in the same manner as surface modification processing for a first polyimide film 11. A thin conductive film is formed by utilizing an ion-exchange reaction on the surface of the second polyimide film 12 which has been thus subjected to the surface modification processing. The thin conductive film is brought into contact with the first conductive film 21 in the opening 12a. Accordingly, power is fed from the first conductive film 21 to thicken the thin conductive film formed on the second polyimide film 12 by electroplating, thereby making it possible to provide the thickened conductive film 22. The second conductive film 22 has a depression 26 at a position corresponding to the opening 12a. However, the depression 26 is filled with an insulating material 27, as required.

The second conductive film 22 is patterned, as required. Thereafter, an insulating film 13 (e.g., a polyimide film) is formed so as to cover the second conductive film 22 and the surface of the second polyimide film 12 exposed by patterning the second conductive film 22. An opening 13a is formed at a position, avoiding the opening 12a, in the insulating film 13. A bump B is buried in the opening 13a. If an opening 13b is formed in the insulating film 13 in a scribe line region L, the bump B can be formed by the electroplating performed by power feeding through the first conductive film 21 and the second conductive film 22 in the scribe line region L.

As described in the foregoing, according to the second embodiment, a wiring having a two-layer structure can be provided on the wafer W by forming the thin conductive film using the surface modification processing and the ion-exchange reaction for the polyimide films and thickening the thin conductive film using the electroplating.

Although description has been made of the two embodiments of the present invention, the present invention can be embodied in another mode. Although in the above-mentioned first and second embodiments, polyimide resin is used as a material for the first and second insulating films, for example, epoxy resin can be also used. In this case, it is preferable that surface modification processing is processing for immersing in a sulfuric acid solution a wafer having a film composed of epoxy resin formed therein to introduce a sulfo group into a surface of the epoxy resin film. The sulfo group is replaced with metal ions by ion-exchange resin, thereby making it possible to form a thin conductive film on the surface of the epoxy resin film.

Although in the above-mentioned first and second embodiments, the depressions 25 and 26 in the first and second conductive films 21 and 22 are respectively filled with the insulating materials 17 and 27, the filling with the insulating materials 17 and 27 may be omitted.

A metal material having conductive properties, for example, cobalt or nickel can be used in addition to copper as a material for the conductive films 21 and 22. The same is true for a material for the bump B. However, the same material as that for the conductive films 21 and 22 is preferably used as the material for the bump B.

Although in the above-mentioned second embodiment, description has been made of an example in which the wiring having a two-layer structure is provided on the active surface Wa of the wafer W, a multi-layered wiring structure comprising three or more layers can be also formed in the same manner.

Although in the above-mentioned first and second embodiments, description has been made of an example in which both the first and second insulating films are composed of polyimide resin, they may be composed of epoxy resin, as described above, and they may be respectively composed of different insulating resin materials.

Although the present invention has been described and illustrated in detail, it is clearly understood that the same is by way of illustration and example only and is not to be taken by way of limitation, the spirit and scope of the present invention being limited only by the terms of the appended claims.

The application corresponds to Japanese Patent Application Serial No. 2000-89174 filed with the Japanese Patent Office on Mar. 28, 2000, the disclosure of which is incorporated herein by reference.

What is claimed is:

1. A semiconductor device comprising:
    a pad for electrical connection provided on a semiconductor substrate;
    a first insulating film with which a surface of the semiconductor substrate is coated and having an opening to which the pad is exposed;
    a conductive film joined to the pad on a bottom surface of the opening of the first insulating film and extending to a surface of the first insulating film outside the opening;
    a second insulating film with which the conductive film is coated and having an opening to which a part of the conductive film is exposed; and
    a connecting member arranged so as to be joined to the conductive film inside the opening of the second insulating film, wherein
        the connecting member includes a bump for connection to another solid device, the bump projecting from a surface of the second insulating film.

2. The semiconductor device according to claim 1, wherein
    the connecting member includes another conductive film joined to the conductive film on a bottom surface of the opening of the second insulating film and extending to a surface of the second insulating film outside the opening.

3. The semiconductor device according to claim 1, wherein
    the first insulating film includes resin having at least one of an imide bond and an acido bond.

4. The semiconductor device according to claim 1, wherein
    the second insulating film includes resin having at least one of an imide bond and an acido bond.

* * * * *